United States Patent [19]

Luzynski

[11] 4,311,981
[45] Jan. 19, 1982

[54] MAGNETIC SWITCH

[76] Inventor: Anthony J. Luzynski, 3526 Sheffield Ave., Philadelphia, Pa. 19136

[21] Appl. No.: 207,414

[22] Filed: Nov. 17, 1980

[51] Int. Cl.³ .................. H01L 43/04; H01L 43/06
[52] U.S. Cl. .................. 338/32 H; 323/368; 338/275; 335/207
[58] Field of Search .......... 338/32 H, 32 R, 275; 335/207; 323/368; 324/251; 307/309, 278

[56] References Cited

U.S. PATENT DOCUMENTS

| | | | |
|---|---|---|---|
| 3,873,957 | 3/1975 | Würscher et al. | 335/307 X |
| 3,950,719 | 4/1976 | Maxwell | 335/207 X |
| 4,188,605 | 2/1980 | Stout | 338/32 H |

FOREIGN PATENT DOCUMENTS 130869 10/1979 Japan ................. 338/32 H

*Primary Examiner*—C. L. Albritton
*Attorney, Agent, or Firm*—Robert K. Youtie

[57] ABSTRACT

An electric switch magnetically activatable including a Hall Effect sensor with a permanent magnet fixed on one side of the sensor and magnetic shielding interposed between the sensor and fixed magnet to direct flux away from the sensor, such that an operating magnet upon movement toward and away from the other side of the sensor cooperates with fixed magnet to produce an increased magnetic field through the sensor to activate the latter.

7 Claims, 3 Drawing Figures

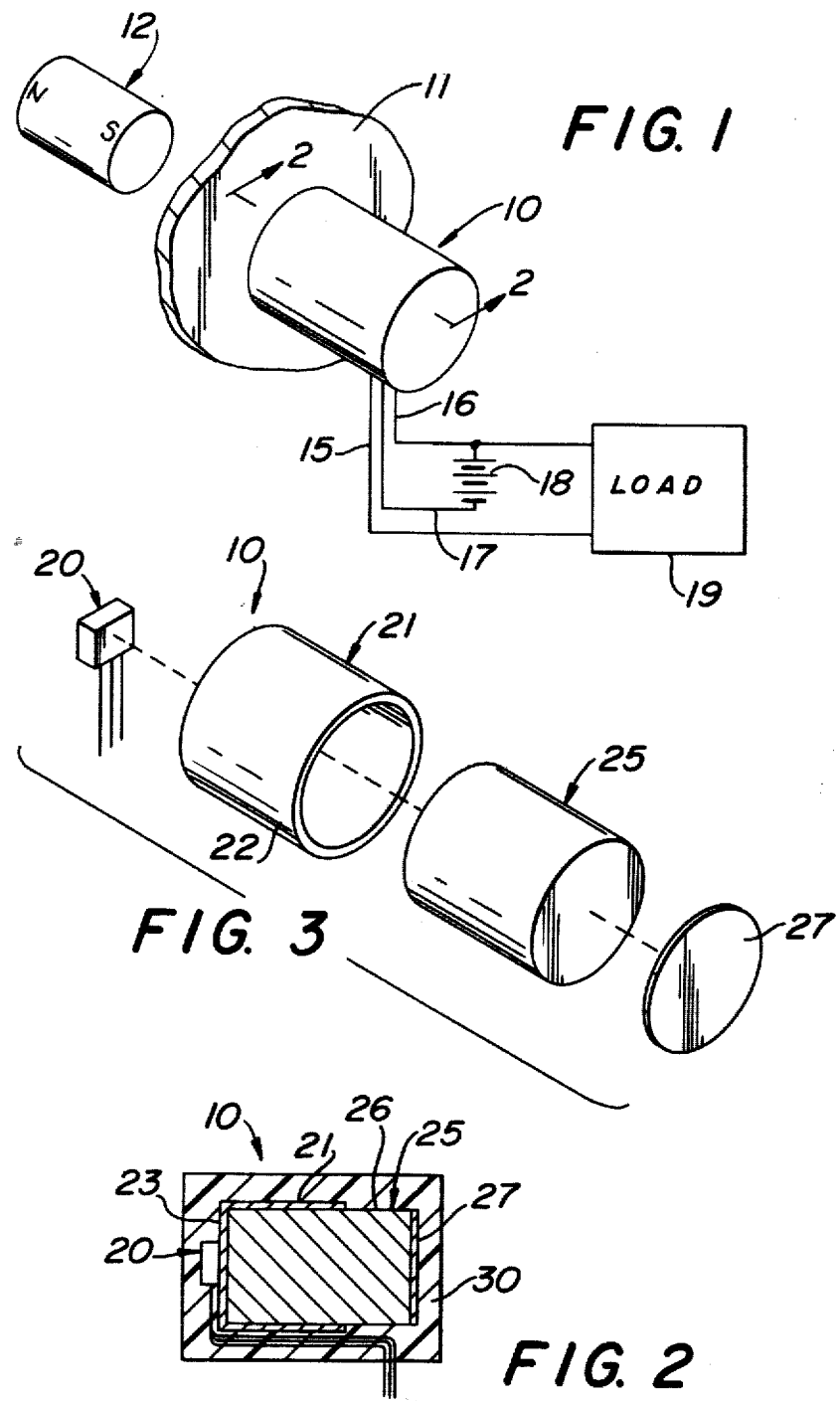

MAGNETIC SWITCH

BACKGROUND OF THE INVENTION

While there have, in the past, been provided magnetically activatable switches, such switches have required for activation relatively heavy flux density, obtainable from either an excessively large magnet or a magnet unduly close to the switch. In many situations it is desirable to use a relatively small magnet, as for convenience of portability, and it is often difficult or impossible to obtain sufficiently close access to activate a magnetic switch with a magnet of reasonable size.

While the magnetic switch of the present invention has many applications, one intended use is as a concealed disabling switch for a security system, such as that of my co-pending U.S. patent application Ser. No. 189,106 filed Sept. 22, 1980. In such an application, a magnetic disabling switch may be conveniently mounted in a concealed location behing the plastic grill of an automobile, and the grill may well be of a thickness approximating ¼ inch. Thus, proximity to the magnetic switch would be limited to about 174 inch, which is too great a distance through which to activate a conventional magnetic switch with a portable magnet of convenient size.

While the magnetic switch of the present invention has been primarily developed for use with a motor vehicle security system, and may be described with reference thereto, it is appreciated that the instant switch is capable of many varied applications, all of which are intended to comprehended herein.

SUMMARY OF THE INVENTION

Accordingly, it is an important object of the present invention to provide a magnetically activated electric switch which is quite small for convenient concealment, entirely reliable in operation throughout a long useful life, and which is of enhanced magnetic sensitivity for activation by less magnetic flux than heretofore possible, so that an activating magnet may be relatively small for convenient portability while being capable of activating the magnetic switch from a substantial distance to greatly increase the possible mounting location of the switch without limiting operating access to the switch.

Other objects of the present invention will become apparent upon reading the following specification and referring to the accompanying drawings, which form a material part of this disclosure.

The invention accordingly consists in the features of construction, combinations of elements, and arrangements of parts, which will be exemplified in the construction hereinafter described, and of which the scope will be indicated by the appended claims.

BRIEF DESCRIPTION OF THE DRAWING

FIG. 1 is a perspective view showing a switch of the present invention mounted behind a concealing member, and illustrating an electrical schematic associated with the switch.

FIG. 2 is a sectional view taken generally along the line 2—2 of FIG. 1.

FIG. 3 is an exploded perspective view showing the elements of the switch of the instant invention apart from encapsulation.

DESCRIPTION OF THE PREFERRED EMBODIMENT

Referring now more particularly to the drawing, and specifically to FIG. 1 thereof, a switch of the present invention is there generally designated 10, and is mounted in a concealed position, say behind a concealing barrier or wall 11, say of plastic, glass or other nonmagnetic material. On the outer, or exterior side of the concealing barrier 11 there is shown a portable operating magnet 12, which may be cylindrical or other suitable configuration, and provided with north and south poles, as indicated.

Extending from the switch 10 are an output conductor 15, a positive conductor 16, and a negative or common conductor 17. A voltage source or battery 18 is connected between the positive and negative conductors 16 and 17, for operating the switch 10. That is, the switch 10 opens and closes a circuit between output and positive conductors 15 and 16, across which is connected a load 19.

As noted hereinbefore, the load 19 may be a vehicle security apparatus, as described in said copending patent application, or other load, as desired.

The details of the switch 10 are shown in FIGS. 2 and 3. It will there be seen that the switch 10 includes a Hall Effect digital sensor 20, which is an electronic switch responsive to the sensing of a magnetic field. Specifically, the sensor 10 may include a silicon Hall generator, amplifier, trigger and output stage integrated with its own voltage regulator onto a monolithic silicon chip. Such a Hall Effect sensor is conventional, a satisfactory sensor being that sold by Radio Shack catalog no. 276–1646. The sensor 20, apart from the switch 10, requires a permanent magnet of 1000 gauss be placed approximately 0.085 inches from the sensor to operate the same. However, as will appear more fully hereinafter, such a permanent magnet will operate applicant's switch 10 from a distance of about 5/16 inches.

In addition to the sensor 20, the switch 10 includes a cup or container 21 fabricated of shielding material, such as magnetically permeable iron, located adjacent to and opening away from the sensor 20. More specifically, the shielding means 21 may be defined by a generally cup shaped container including a cylindrical side wall 22, and a circular end closure or end wall 23. The wall 23 closes one end of the cylindrical side wall 22, the other end remaining open. As best seen in FIG. 2, the closed end 23 of the shielding container 21 is proximate to and against one side of the sensor 20.

A magnet 25, say a a generally cylindrical magnet has one end conformably engaged in and substantially fully occupying the interior of shielding container 21. As seen in FIG. 2, the north pole of magnet 25 extends into the shielding container 21 to the end wall 23. Thus, the north pole end of magnet 25 is completely encompassed by the shielding container 21, and the side wall of the shielding container extends toward the south pole end of magnet 25, terminating short of the south pole end to leave an unshielded south pole peripheral region 26 of the magnet 25. Over the south pole end of the magnet 25 is an additional shielding element 27, say a disc shaped piece of iron sheet or other suitable shielding material, congruently overlying the south pole end of magnet 25.

In the assembled condition shown in FIG. 2, with the exterior of shielding wall 23 against the sensor 20, and the magnet 25 conformably engaged in container 21 with the magnet north pole against the container end wall 23, and the additional magnetic shielding 27 against the south pole end of magnet 25, the assemblage is encapsulated or potted in a totally encompassing body of epoxy or suitable insulation or potting material.

In the assembled condition shown in FIG. 2, the flux field of magnet 25 is effectively shielded from sensor 20, so that the latter is not operated. However, upon the approach of portable operating magnet 12 in general axial alignment with the magnet 25, and the south pole of magnet 12 adjacent to the sensor 20, the combined magnetic fields of magnets 25 and 12 augment the flux density through sensor 20 so that operation of the sensor occurs when the operating magnet 12 moves up to about 5/16 inches from the switch 10. It is believed that the shielded flux of magnet 25 is guided outward through the unshielded region 26 and combines with the flux of portable magnet 12 to augment the flux of the latter and thereby obtain the enhanced magnetic sensitivity of the switch 10.

From the foregoing, it is seen that the present invention provides a magnetically activated switch which is extremely simple in construction and of enhanced magnetic sensitivity, without greatly increased cost or space requirements, so as to permit of use with more limited access than prior magnetic switches.

Although the present invention has been described in some detail by way of illustration and example for purposes of clarity of understanding, it is understood that certain changes and modifications may be made within the spirit of the invention.

What is claimed is:

1. A magnetically activated Hall Effect switch of enhanced magnetic sensitivity comprising a Hall Effect digital sensor, a fixed magnet proximate to on side of said sensor, shielding means shielding said fixed magnet from said sensor to prevent activation of the latter by said fixed magnet only, said shielding means being configured to shield said fixed magnet between the latter and said sensor and leave unshielded a region of said fixed magnet spaced from said sensor, and an operating magnet movable toward and away from the other side of said sensor with opposite poles of said fixed and operating magnets adjacent to each other to activate the sensor, said operating magnet cooperating with said fixed magnet and shielding means to increase the magnetic field through said sensor for activation thereof with said operating magnet at a greater distance from said sensor than possible without said fixed magnet.

2. A magnetically activated Hall Effect switch according to claim 1, said fixed magnet having one pole adjacent to said sensor and the other pole remote from said sensor, said shielding means entirely covering said fixed magnet except for a region remote from said sensor, to guide flux away from said sensor.

3. A magnetically activated Hall Effect switch according to claim 1, said sensor, fixed magnet and shielding means being encapsulated as a unit.

4. A magnetically activated Hall Effect switch according to claim 1, said fixed magnet having one pole adjacent to said sensor and the other pole remote from said sensor, said shielding means comprising a container entirely encompassing said one pole and extending to a point adjacent to and short of said other pole, for directing magnetic flux of said fixed magnet away from said sensor.

5. A magnetically activated Hall Effect switch according to claim 4, said shielding means comprising additional shielding overlying said other pole and spaced from said container, for directing magnetic flux laterally outwardly through the space between said container and additional shielding.

6. A magnetically activated Hall Effect switch according to claim 5, said sensor, fixed magnet, container and additional shielding being encapsulated as a unit.

7. A magnetically activated Hall Effect switch according to claim 1, said operating magnet being free for portability.

* * * * *